United States Patent
Liu

(10) Patent No.: US 10,043,991 B2
(45) Date of Patent: Aug. 7, 2018

(54) ARRAY SUBSTRATE AND MANUFACTURING METHOD THEREOF

(71) Applicant: WUHAN CHINA STAR OPTOELECTRONICS TECHNOLOGY CO., LTD., Wuhan, Hubei (CN)

(72) Inventor: Zhe Liu, Hubei (CN)

(73) Assignee: WUHAN CHINA STAR OPTOELECTRONICS TECHNOLOGY CO., LTD., Wuhan, Hubei (CN)

(*) Notice: Subject to any disclaimer, the term of this patent is extended or adjusted under 35 U.S.C. 154(b) by 138 days.

(21) Appl. No.: 15/312,055

(22) PCT Filed: Sep. 9, 2016

(86) PCT No.: PCT/CN2016/098562
§ 371 (c)(1),
(2) Date: Nov. 17, 2016

(87) PCT Pub. No.: WO2018/032558
PCT Pub. Date: Feb. 22, 2018

(65) Prior Publication Data
US 2018/0182986 A1 Jun. 28, 2018

(30) Foreign Application Priority Data
Aug. 17, 2016 (CN) .......................... 2016 1 0679485

(51) Int. Cl.
*H01L 51/52* (2006.01)
*H01L 51/05* (2006.01)
*H01L 51/00* (2006.01)
*H01L 27/28* (2006.01)

(52) U.S. Cl.
CPC ........ *H01L 51/0558* (2013.01); *H01L 27/283* (2013.01); *H01L 51/0008* (2013.01)

(58) Field of Classification Search
None
See application file for complete search history.

(56) References Cited

U.S. PATENT DOCUMENTS

| | | | | |
|---|---|---|---|---|
| 2005/0170565 A1* | 8/2005 | Fujii | ...................... | H01L 27/12 438/149 |
| 2007/0013077 A1* | 1/2007 | Lee | ................... | H01L 23/53238 257/762 |
| 2007/0290229 A1* | 12/2007 | Choi | ................... | G02F 1/13624 257/192 |
| 2008/0099757 A1* | 5/2008 | Furukawa | ............ | C07D 209/88 257/40 |
| 2010/0133572 A1* | 6/2010 | Hirai | ................... | H01L 27/3246 257/98 |

(Continued)

*Primary Examiner* — Michael Lebentritt
(74) *Attorney, Agent, or Firm* — Ladas & Parry LLP

(57) ABSTRACT

An array substrate and a manufacturing method thereof are provided. The method comprises steps of: forming a first metal layer, a gate insulation layer, a second metal layer, and a barrier layer; and patterning the barrier layer to form a gap portion by etching a portion of the barrier layer corresponding to a channel location. The width of one side of the gap portion close to the second metal layer is greater than that of the other side of the gap portion far away from the second metal layer.

15 Claims, 4 Drawing Sheets

(56) References Cited

U.S. PATENT DOCUMENTS

| | | | | |
|---|---|---|---|---|
| 2011/0057208 A1* | 3/2011 | Jeon | ................... | H01L 51/5246 |
| | | | | 257/88 |
| 2011/0297938 A1* | 12/2011 | Kawashima | ........ | H01L 51/0009 |
| | | | | 257/57 |
| 2011/0297942 A1* | 12/2011 | Kim | ................... | H01L 27/3276 |
| | | | | 257/59 |
| 2011/0297944 A1* | 12/2011 | Choi | ................... | H01L 27/124 |
| | | | | 257/59 |
| 2015/0115256 A1* | 4/2015 | You | ................... | H01L 27/3265 |
| | | | | 257/40 |
| 2017/0059906 A1* | 3/2017 | Cho | ...................... | G02F 1/1339 |
| 2017/0098666 A1* | 4/2017 | Kim | ................... | H01L 27/1222 |
| 2017/0125505 A1* | 5/2017 | Oh | ......................... | H01L 51/52 |
| 2017/0250289 A1* | 8/2017 | Sugawara | ......... | H01L 29/78606 |
| 2017/0263895 A1* | 9/2017 | Lee | ................... | H01L 51/5271 |
| 2018/0053905 A1* | 2/2018 | Lee | ................... | H01L 27/3262 |

* cited by examiner

ARRAY SUBSTRATE AND MANUFACTURING METHOD THEREOF

FIELD OF THE INVENTION

The present invention relates to a technical field of liquid crystal displays, and more particularly to an array substrate and a manufacturing method thereof.

BACKGROUND OF THE INVENTION

Nowadays, there are mainly two methods, a small molecule deposition method and a macromolecule solution method, to be used to form a pattern of an organic semiconductor layer of an organic thin film transistor. That is, the whole of the organic semiconductor layer is made as a channel shape. In the small molecule deposition method for an organic semiconductor material, an auxiliary by a metal mask is usually needed, so as to pattern the whole of the organic semiconductor layer to form the channel.

However, the above-mentioned two methods cannot make a fine pattern size, and the metal mask net is difficult to be washed and prepared. Additionally, in the macromolecule solution method for an organic semiconductor material, a photoresist coating process is necessary, so that organic solvents, such as an organic photoresist, directly contact with the organic semiconductor layer. Because the organic solvents, such as the organic photoresist, easily erode the organic semiconductor layer, the performance of the thin film transistor is lowered.

Hence, it is necessary to provide an array substrate and a manufacturing method thereof, so as to solve the problems existing in the conventional technologies.

SUMMARY OF THE INVENTION

The object of the present invention is to provide an array substrate and a manufacturing method thereof to solve a technical problem that in a channel forming method existing in traditional technologies, the performance of a thin film transistor is easy to be lowered.

In order to solve the above-mentioned technical problems, the present invention provides a manufacturing method of an array substrate, which comprises steps of:
forming a buffer layer on a base substrate;
forming a first metal layer on the buffer layer, and patterning the first metal layer to form a gate electrode;
forming a gate insulation layer on the gate electrode and a portion of the base substrate uncovered with the gate electrode;
forming a second metal layer on the gate insulation layer, and patterning the second metal layer to form a drain electrode and a source electrode;
forming a barrier layer on the second metal layer, and patterning the barrier layer to form a gap portion by etching a portion of the barrier layer corresponding to a channel location, wherein a width of one side of the gap portion close to the second metal layer is greater than that of the other side of the gap portion far away from the second metal layer;
depositing an organic semiconductor material on the barrier layer, forming a channel in a region of the organic semiconductor material corresponding to the gap portion, and forming a deposition portion on the barrier layer;
removing the deposition portion and the barrier layer;
forming a second insulation layer on the channel;
forming a conductive through hole in the second insulation layer to connect with the second metal layer; and
forming a transparent conducting layer on the second insulation layer and in the conductive through hole.

In the manufacturing method of the array substrate, the step of forming the barrier layer on the second metal layer, and patterning the barrier layer to form the gap portion by etching the portion of the barrier layer corresponding to the channel location further comprises steps of:
forming a first barrier layer and a second barrier layer on the second metal layer, respectively; patterning the second barrier layer, wherein a portion of the second barrier layer corresponding to the channel location is etched, so as to form the second gap portion; and
patterning the first barrier layer, wherein a portion of the first barrier layer corresponding to the channel location is etched, so as to form the first gap portion, wherein a width of the second gap portion is smaller than that of the first gap portion.

In the manufacturing method of the array substrate, a thickness of the barrier layer is greater than a thickness of the drain electrode or the source electrode.

In the manufacturing method of the array substrate, the organic semiconductor material is deposited by a thermal evaporation, sputtering, or pulsed laser deposition method.

In order to solve the above-mentioned technical problems, the present invention provides a manufacturing method of an array substrate, which comprises steps of:
forming a first metal layer on a base substrate, and patterning the first metal layer to form a gate electrode;
forming a gate insulation layer on the gate electrode and a portion of the base substrate uncovered with the gate electrode;
forming a second metal layer on the gate insulation layer, and patterning the second metal layer to form a drain electrode and a source electrode;
forming a barrier layer on the second metal layer, and patterning the barrier layer to form a gap portion by etching a portion of the barrier layer corresponding to a channel location, wherein a width of one side of the gap portion close to the second metal layer is greater than that of the other side of the gap portion far away from the second metal layer;
depositing an organic semiconductor material on the barrier layer, forming a channel corresponding to the gap portion, and forming a deposition portion on the barrier layer;
forming a second insulation layer on the deposition portion;
forming a conductive through hole on the second insulation layer to connect with the second metal layer; and
forming a transparent conducting layer on the second insulation layer and in the conductive through hole.

In the manufacturing method of the array substrate, the step of forming the first metal layer on the base substrate further comprises steps of:
forming a buffer layer on the base substrate; and
forming the first metal layer on the buffer layer.

In the manufacturing method of the array substrate, the step of forming the barrier layer on the second metal layer, and patterning the barrier layer to form the gap portion by etching the portion of the barrier layer corresponding to the channel location further comprises steps of:
forming a first barrier layer and a second barrier layer on the second metal layer, respectively; patterning the second barrier layer, wherein a portion of the second barrier layer corresponding to the channel location is etched, so as to form the second gap portion; and
patterning the first barrier layer, wherein a portion of the first barrier layer in a region of the organic semiconductor material corresponding to the channel location is etched, so as to form the first gap portion, wherein a width of the second gap portion is smaller than that of the first gap portion.

In the manufacturing method of the array substrate, a thickness of the barrier layer is greater than that of the drain electrode and the source electrode.

In the manufacturing method of the array substrate, the step of forming the second insulation layer on the deposition portion further comprises steps of:
removing the deposition portion and the barrier layer; and forming a second insulation layer on the channel.

In the manufacturing method of the array substrate, the organic semiconductor material is deposited by a thermal evaporation, sputtering, or pulsed laser deposition method.

The present invention further provides an array substrate, which comprises:
a base substrate;
a first metal layer located on the base substrate, wherein the first metal layer includes a gate electrode area of a thin film transistor;
a gate insulation layer partially located on the first metal layer, and configured to separate the first metal layer and a second metal layer;
the second metal layer located on the gate insulation layer, and including a drain electrode area and a source electrode area of the thin film transistor;
a barrier layer located on the second metal layer, wherein the barrier layer includes a gap portion; the gap portion is corresponding to a channel location, wherein a width of one side of the gap portion close to the second metal layer is greater than that of the other side of the gap portion which far away from the second metal layer;
an organic semiconductor layer including a channel, wherein the channel is corresponding to a location of the gap portion;
a second insulation layer located on the barrier layer, and being provided with a conductive through hole; and
a transparent conducting layer located on the second insulation layer, wherein the transparent conducting layer comprises a pixel electrode; and the pixel electrode is connected with the second metal layer through the conductive through hole.

In the array substrate, the organic semiconductor layer further includes a deposition portion, and the deposition portion is located between the barrier layer and the second insulation layer.

In the array substrate, the barrier layer includes a first barrier layer and a second barrier layer; the second barrier layer is located on the first barrier layer; the first barrier layer includes a first gap portion, and the second barrier layer includes a second gap portion; and a width of the second gap portion is smaller than that of the first gap portion.

In the array substrate, a thickness of the barrier layer is greater than that of the drain electrode and the source electrode.

In the array substrate, the base substrate includes a buffer layer, and the buffer layer is located between the first metal layer and the base substrate.

In the array substrate and the manufacturing method thereof according to the present invention, by the patterned barrier layer to define a pattern of the channel, and by a depositing method to form the channel, so as to prevent the organic photoresist material from eroding the organic semiconductor material, and the performance of the thin film transistor is improved.

DETAILED DESCRIPTION OF THE PREFERRED EMBODIMENTS

Figure 1:
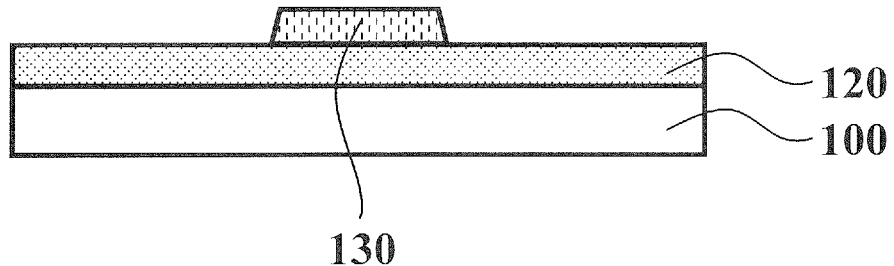
FIG. 1 is a schematic structural view of step 1 of a manufacturing method of an array substrate according to a first embodiment of the present invention.

The foregoing objects, features, and advantages adopted by the present invention can be best understood by referring to the following detailed description of the preferred embodiments and the accompanying drawings. Furthermore, the directional terms described in the present invention, such as upper, lower, front, rear, left, right, inside, outer, side, etc., are only directions with reference to the accompanying drawings, so that the used directional terms are used to describe and understand the present invention, but the present invention is not limited thereto. In the drawings, units with similar structures use the same numerals.

Refer now to FIGS. 1 to 7, wherein FIG. 1 is a schematic structural view of step 1 of a manufacturing method of an array substrate according to a first embodiment of the present invention.

A manufacturing method of an array substrate according to the present invention comprises:

S101: forming a first metal layer on a base substrate, and patterning the first metal layer to form a gate electrode.

As shown in FIG. 1, a buffer layer 120 can be firstly formed on a base substrate 100, and a first metal layer is next formed on the buffer layer 120. The buffer layer 120 is configured to protect a thin film transistor, preventing water molecules, sodium ions or potassium ions from entering into the thin film transistor. In the step of S101, specifically, by a mask with a pattern, the first metal layer is exposed, developed, and etched to form a gate electrode 130, and a portion of the first metal layer excluded the gate electrode 130 is etched in this process. The material of the first metal layer can be chromium (Cr), molybdenum (Mo), aluminum (Al), copper (Cu), etc.

S102: forming a gate insulation layer on the gate electrode and a portion of the base substrate uncovered with the gate electrode.

Figure 2:
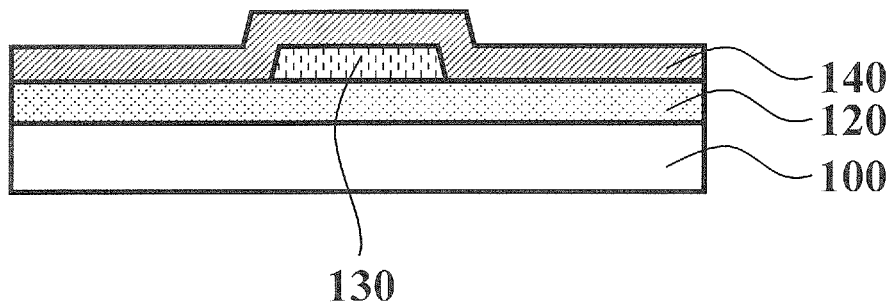
FIG. 2 is a schematic structural view of step 2 of the manufacturing method of the array substrate according to the first embodiment of the present invention.

As shown in FIG. 2, a gate insulation layer 140 is formed on the gate electrode 130 and the portion of the base substrate uncovered with the gate electrode. When the array substrate is disposed the buffer layer 120, the gate insulation layer 140 is located on the gate electrode 130 and the portion of the buffer layer 120 uncovered with the gate electrode. The gate insulation layer 140 is configured to separate the first metal layer and a second metal layer.

S103: forming a second metal layer on the gate insulation layer, and patterning the second metal layer to form a drain electrode and a source electrode.

Figure 3:
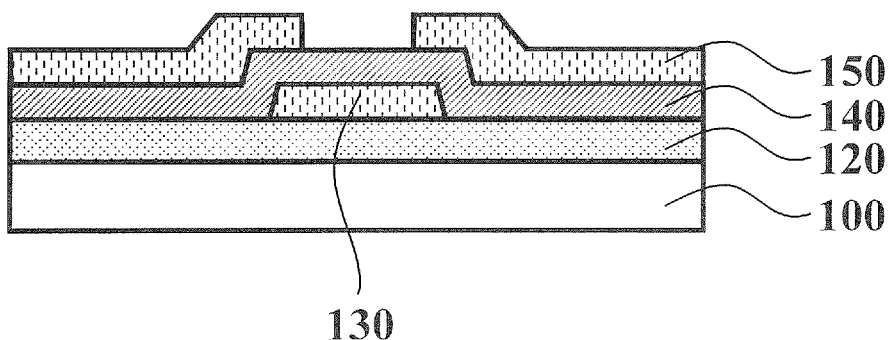
FIG. 3 is a schematic structural view of step 3 of the manufacturing method of the array substrate according to the first embodiment of the present invention.

As shown in FIG. 3, a second metal layer 150 is formed on the gate insulation layer 140. In the step of S103, specifically, by a mask with a pattern, the second metal layer 150 is exposed, developed, and etched to form a drain electrode and a source electrode, and a portion of the second metal layer excluded the drain electrode and the source electrode is etched in this process.

S104: forming a barrier layer on the second metal layer, and patterning the barrier layer to form a gap portion by etching a portion of the barrier layer corresponding to a channel location.

Figure 4:
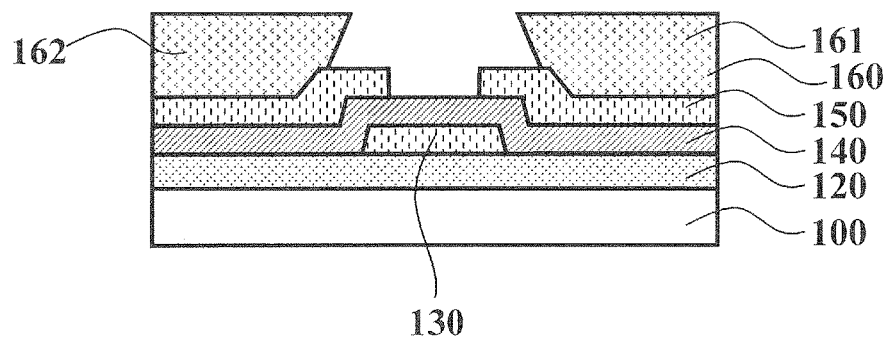
FIG. 4 is a schematic structural view of step 4 of the manufacturing method of the array substrate according to the first embodiment of the present invention.

As shown in FIG. 4, the whole of a barrier layer is firstly formed on the second metal layer 150, and the barrier layer 160 is patterned, for example by an exposing-developing-etching process. After etching, a portion of the barrier layer corresponding to a channel location is etched, and then a left portion 162 and a right portion 161 are kept. The etched portion is called a gap portion, which is also an empty portion between the left portion 162 and the right portion 161. In the barrier layer 160, a lower portion thereof is over etched than an upper portion thereof, wherein the width of one side of the gap portion which closes to the second metal layer is greater than the width of the other side of the gap portion which far away from the second metal layer. That is, at the location as shown in the figure, a gap between the left portion 162 and the right portion 161 is decreased from bottom to top.

Preferably, a thickness of the barrier layer 160 is greater than a thickness of the drain electrode and the source electrode. Therefore, when depositing an organic semiconductor material, it can prevent that the organic semiconductor material on the barrier layer 160 contacts with the organic semiconductor material on the second metal layer, so as to accomplish that a conducting channel is patterned and contacts with the drain electrode and the source electrode thereafter. The material of the barrier layer 160 can be an organic insulating material.

S105: depositing an organic semiconductor material on the barrier layer, forming a channel in a region of the organic semiconductor material corresponding to the gap portion, and forming a deposition portion on the barrier layer.

Figure 5:
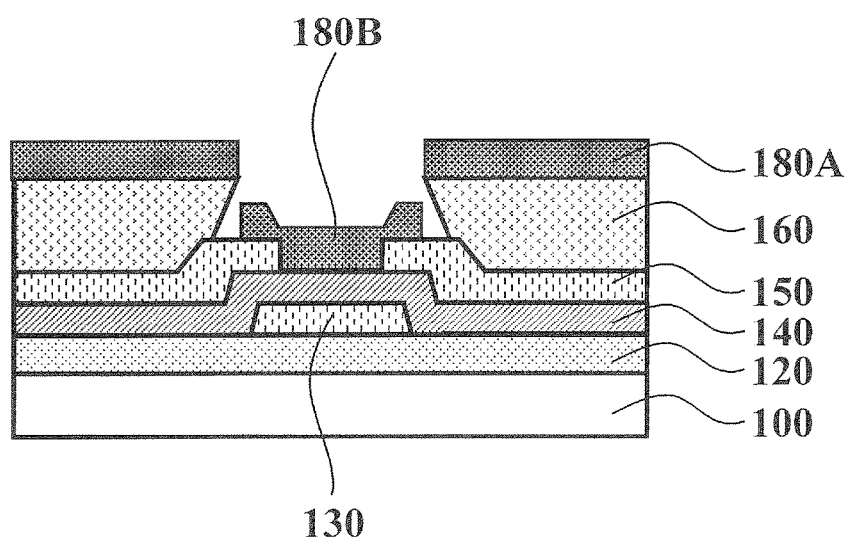
FIG. 5 is a schematic structural view of step 5 of the manufacturing method of the array substrate according to the first embodiment of the present invention.

As shown in FIG. 5, an organic semiconductor (OSC) material is deposited on the barrier layer 160, wherein the depositing method can be thermal evaporation, sputtering, or pulsed laser deposition, etc. After depositing, a portion of the organic semiconductor material which is not blocked by the barrier layer 160 is deposited on an area between the drain electrode and the source electrode to form a channel 180B. The channel is configured to connect with the source electrode and the drain electrode. A portion of the organic semiconductor material which is blocked by the barrier layer 160 is deposited on the barrier layer 160 to form deposition portion 180A, which are separated from the channel 180B in space.

Because the barrier layer with an above-mentioned pattern is used to be a depositing pattern plate, it can assist define a pattern of the conducting channel, so as to obtain a high precision channel pattern. Secondly, because it does not need an exposing-developing-etching process to the whole of the organic semiconductor layer, so as to prevent that the organic semiconductor material and the organic photoresist from polluting and eroding each other. Additionally, it can reduce using a fine metal mask (FFM) in a traditional evaporation method, so as to lower a cost which defines a pattern of an organic semiconductor layer in the evaporation method.

S106: forming a second insulation layer on the deposition portion.

Figure 6:
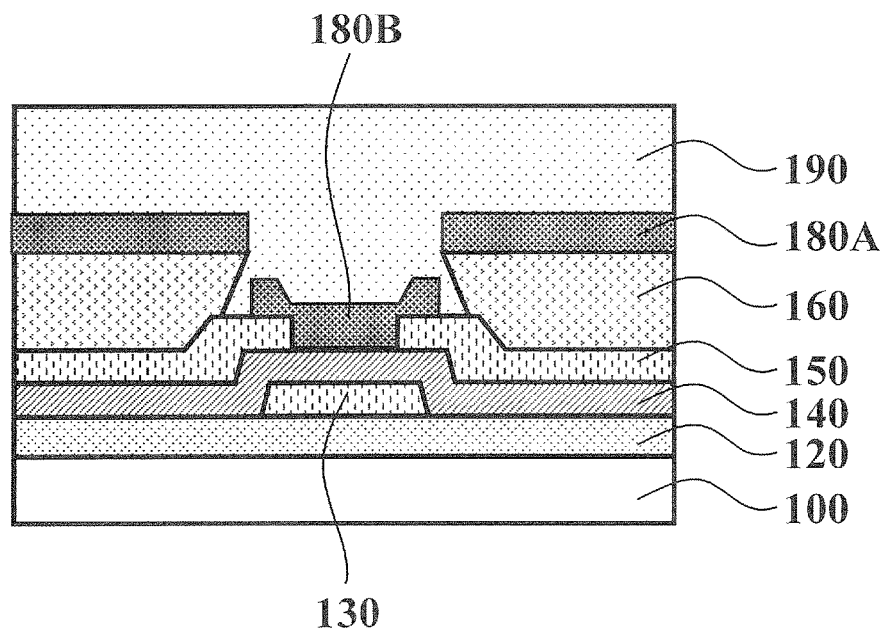
FIG. 6 is a schematic structural view of step 6 of the manufacturing method of the array substrate according to the first embodiment of the present invention.

As shown in FIG. 6, a second insulation layer 190 is formed on the deposition portion 180A, wherein the second insulation layer 190 is configured to make a surface of the array substrate smoother.

S107: forming a conductive through hole in the second insulation layer to connect with the second metal layer.

Figure 7:
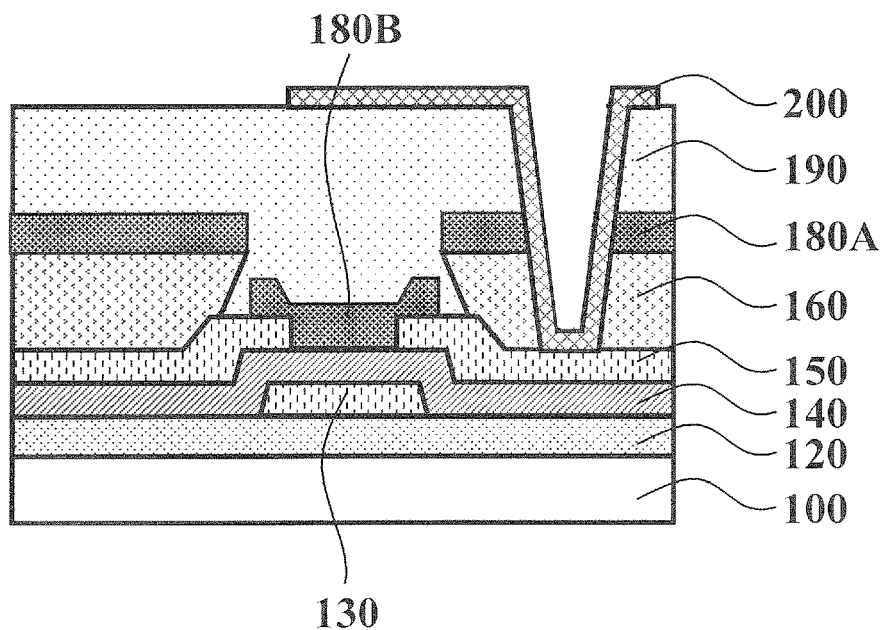
FIG. 7 is a schematic structural view of step 7 of the manufacturing method of the array substrate according to the first embodiment of the present invention.

As shown in FIG. 7, by a dry etching or wet etching method, a conductive through hole is formed in the second insulation layer 190.

S108: forming a transparent conducting layer on the second insulation layer and in the conductive through hole.

As shown in FIG. 7, it is possible to use a sputter coating method to form a transparent conducting layer 200 on the second insulation layer 190 with the conductive through hole. The transparent conducting layer 200 comprises a pixel electrode, wherein the pixel electrode can be made by a wet etching method. The conductive through hole is configured to connect with the pixel electrode and the drain electrode of the second metal layer.

It can be understood that the above-mentioned method can be used to define a pattern of a semiconductor layer, an insulating dielectric layer, a conducting electrode layer, or other function layers.

As shown in FIG. 7, this embodiment further provides an array substrate, the array substrate comprises: a base substrate 100, a first metal layer, a gate insulation layer 140, a second metal layer 150, a barrier layer 160, organic semiconductor layers 180A or 180B, a second insulation layer 190, and a transparent conducting layer 200. The array substrate of the embodiment can further comprise a buffer layer 120. The buffer layer 120 is located between the base substrate 100 and the first metal layer.

The first metal layer is located on the buffer layer 120. The first metal layer includes a gate electrode area 130. The gate insulation layer 140 is partially located on the first metal layer, and is configured to separate the first metal layer and the second metal layer 150. The second metal layer 150 is located on the gate insulation layer 140, and includes a drain electrode area and a source electrode area of a thin film transistor. The barrier layer 160 is located on the second metal layer 150. The barrier layer 160 includes a gap portion. The gap portion corresponds with a channel location, wherein the width of the gap portion which closes to the second metal layer is greater than the width of the gap portion which far away from the second metal layer, namely, a bottom portion of the barrier layer is etched and wider than a top portion thereof. The organic semiconductor layers includes a channel 180B and deposition portion 180A. The channel is located on a channel area, namely corresponds with the location of the gap portion. The deposition portion 180A is located on the barrier layer 160. The second insulation layer 190 is located on the deposition portion 180A. The second insulation layer 190 is provided with a conductive through hole. The transparent conducting layer 200 is located on the second insulation layer 190. The transparent conducting layer 200 comprises a pixel electrode, wherein the pixel electrode is connected with the second metal layer through the conductive through hole.

In the embodiment, the barrier layer is provided, and a pattern of the channel is defined by the patterned barrier layer, and the channel is formed by a deposition method, so that it is unnecessary to coat a photoresist material on a surface of an organic semiconductor material, so as to prevent the organic photoresist material from eroding the organic semiconductor material, and the performance of the thin film transistor is improved.

Figure 8:
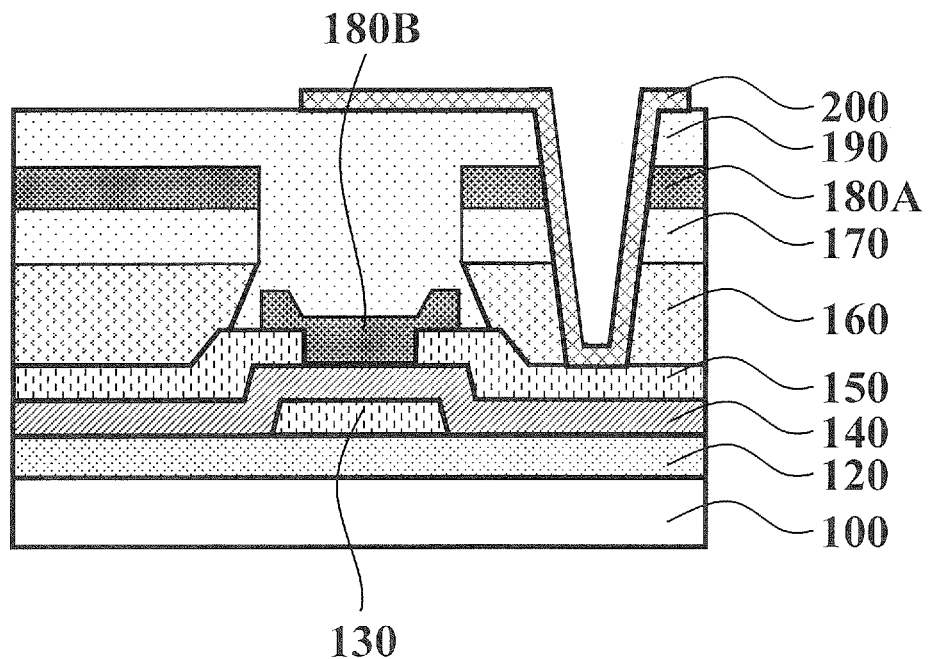
FIG. 8 is a schematic structural view of an array substrate according to a second embodiment of the present invention.

Refer now to FIG. 8, which is a schematic structural view of an array substrate according to a second embodiment of the present invention.

The differences between the array substrates of this embodiment and the last embodiment are that: the barrier layer includes a first barrier layer 160 and a second barrier layer 170, and the second barrier layer 170 is located on the first barrier layer 160; the first barrier layer 160 includes a first gap portion, and the second barrier layer 170 includes a second gap portion; and a width of the second gap portion is smaller than a width of the first gap portion.

The differences between the manufacturing methods of the array substrates of this embodiment and the last embodiment are that: the step S104 of the last embodiment is executed as follows:

S201: forming a first barrier layer 160 and a second barrier layer 170 on the second metal layer, respectively; patterning the second barrier layer 170, wherein a portion of the second barrier layer corresponding to a channel location is etched, so as to form the second gap portion; and then patterning the first barrier layer 160, wherein a portion of the first barrier layer corresponding to the channel location is etched, so as to form the first gap portion.

As shown in FIG. 8, the first barrier layer 160 and the second barrier layer 170 are formed on the second metal layer, and portions of the first and second barrier layer which correspond with the channel location are etched to form the first and second gap portions, wherein the first barrier layer is over etched than the second barrier layer, namely the width of the second gap portion is smaller than the width of the first gap portion. Because there are two barrier layers provided, when depositing an organic semiconductor material, it can better prevent that the organic semiconductor material in the channel portion from being connected with the organic semiconductor material on the barrier layer.

It can be understood that the total number of the barrier layers can be two layers or more than two layers; and the material of each of the barrier layers can be the same or different.

In the embodiment, because there are two barrier layers provided, when forming the channel by depositing method, it can better prevent that the organic semiconductor materials which are deposited in the channel portion and on the barrier layer are connected with each other, so as to accomplish that a conducting channel is patterned and contacts with the drain electrode and the source electrode thereafter.

Figure 9:
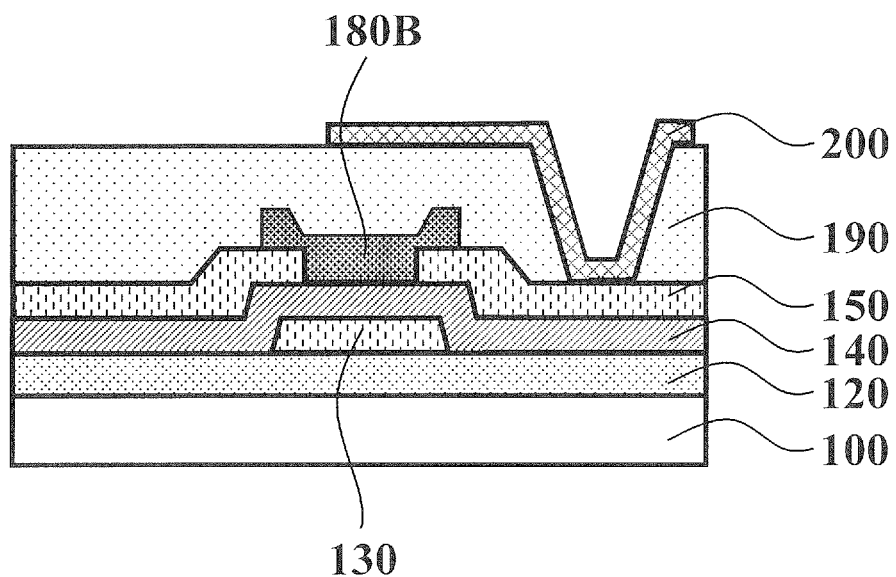
FIG. 9 is a schematic structural view of an array substrate according to a third embodiment of the present invention.

Refer now to FIG. 9, which is a schematic structural view of an array substrate according to a third embodiment of the present invention.

The differences between the array substrates of this embodiment and the first embodiment are that: the array substrate does not comprises a barrier layer and deposition portion.

The differences between the manufacturing methods of the array substrates of this embodiment and the first embodiment are that: the step S106 of the last embodiment is executed as follows:

S301: removing the deposition portion and the barrier layer.

For example, also refer FIG. 7, the deposition portion 180A on the barrier layer 160 is etched, and further the barrier layer 160 is etched.

S302: forming a second insulation layer on the channel.

The differences between the array substrates of this embodiment and the first embodiment are that: the array substrate does not comprise the barrier layer and the deposition portion. Additionally, the second insulation layer 190 has a function to separate the second metal layer 150 and the transparent conducting layer 200.

Because the barrier layer and the deposition portion are etched, a thickness of the array substrate can be decreased, so that it has an advantage for manufacturing a thinner array substrate.

In the embodiment, there is a barrier layer provided, wherein a portion of the barrier layer corresponding to the channel is etched, and the channel is formed by a deposition method, so that it is unnecessary to coat a photoresist material on a surface of an organic semiconductor material, so as to prevent that the organic photoresist material erodes the organic semiconductor material, and the performance of the thin film transistor is improved. Furthermore, because the barrier layer and the organic semiconductor material on the barrier layer are etched, it can further decrease the thickness of the array substrate.

The present invention has been described with preferred embodiments thereof and it is understood that many changes and modifications to the described embodiment can be carried out without departing from the scope and the spirit of the invention that is intended to be limited only by the appended claims.

What is claimed is:

1. A manufacturing method of an array substrate, comprising steps of:
    forming a buffer layer on a base substrate;
    forming a first metal layer on the buffer layer, and patterning the first metal layer to form a gate electrode;
    forming a gate insulation layer on the gate electrode and a portion of the base substrate uncovered with the gate electrode;
    forming a second metal layer on the gate insulation layer, and patterning the second metal layer to form a drain electrode and a source electrode;
    forming a barrier layer on the second metal layer, and patterning the barrier layer to form a gap portion by etching a portion of the barrier layer corresponding to a channel location, wherein a width of one side of the gap portion close to the second metal layer is greater than that of the other side of the gap portion far away from the second metal layer;
    depositing an organic semiconductor material on the barrier layer, forming a channel in a region of the organic semiconductor material corresponding to the gap portion, and forming a deposition portion on the barrier layer;
    removing the deposition portion and the barrier layer;
    forming a second insulation layer on the channel;
    forming a conductive through hole in the second insulation layer to connect with the second metal layer; and
    forming a transparent conducting layer on the second insulation layer and in the conductive through hole.

2. The manufacturing method of the array substrate according to claim 1, wherein the step of forming the barrier layer on the second metal layer, and patterning the barrier layer to form the gap portion by etching the portion of the barrier layer corresponding to the channel location further comprises steps of:
forming a first barrier layer and a second barrier layer on the second metal layer, respectively; patterning the second barrier layer, wherein a portion of the second barrier layer corresponding to the channel location is etched, so as to form the second gap portion; and
patterning the first barrier layer, wherein a portion of the first barrier layer corresponding to the channel location is etched, so as to form the first gap portion, wherein a width of the second gap portion is smaller than that of the first gap portion.

3. The manufacturing method of the array substrate according to claim 1, wherein a thickness of the barrier layer is greater than that of the drain electrode or the source electrode.

4. The manufacturing method of the array substrate according to claim 1, wherein the organic semiconductor material is deposited by a thermal evaporation, sputtering, or pulsed laser deposition method.

5. A manufacturing method of an array substrate, comprising steps of:
forming a first metal layer on a base substrate, and patterning the first metal layer to form a gate electrode;
forming a gate insulation layer on the gate electrode and a portion of the base substrate uncovered with the gate electrode;
forming a second metal layer on the gate insulation layer, and patterning the second metal layer to form a drain electrode and a source electrode;
forming a barrier layer on the second metal layer, and patterning the barrier layer to form a gap portion by etching a portion of the barrier layer corresponding to a channel location, wherein a width of one side of the gap portion close to the second metal layer is greater than that of the other side of the gap portion far away from the second metal layer;
depositing an organic semiconductor material on the barrier layer, forming a channel corresponding to the gap portion, and forming a deposition portion on the barrier layer;
forming a second insulation layer on the deposition portion;
forming a conductive through hole on the second insulation layer to connect with the second metal layer; and
forming a transparent conducting layer on the second insulation layer and in the conductive through hole.

6. The manufacturing method of the array substrate according to claim 5, wherein the step of forming the first metal layer on the base substrate further comprises steps of:
forming a buffer layer on the base substrate; and
forming the first metal layer on the buffer layer.

7. The manufacturing method of the array substrate according to claim 5, wherein the step of forming the barrier layer on the second metal layer, and patterning the barrier layer to form the gap portion by etching the portion of the barrier layer corresponding to the channel location further comprises steps of:
forming a first barrier layer and a second barrier layer on the second metal layer, respectively; patterning the second barrier layer, wherein a portion of the second barrier layer corresponding to the channel location is etched, so as to form the second gap portion; and
patterning the first barrier layer, wherein a portion of the first barrier layer in a region of the organic semiconductor material corresponding to the channel location is etched, so as to form the first gap portion, wherein a width of the second gap portion is smaller than that of the first gap portion.

8. The manufacturing method of the array substrate according to claim 5, wherein a thickness of the barrier layer is greater than that of the drain electrode and the source electrode.

9. The manufacturing method of the array substrate according to claim 5, wherein the step of forming the second insulation layer on the deposition portion further comprises steps of:
removing the deposition portion and the barrier layer; and
forming a second insulation layer on the channel.

10. The manufacturing method of the array substrate according to claim 5, wherein the organic semiconductor material is deposited by a thermal evaporation, sputtering, or pulsed laser deposition method.

11. An array substrate, comprising:
a base substrate;
a first metal layer located on the base substrate, wherein the first metal layer includes a gate electrode area of a thin film transistor;
a gate insulation layer partially located on the first metal layer, and configured to separate the first metal layer and a second metal layer;
the second metal layer located on the gate insulation layer, and including a drain electrode area and a source electrode area of the thin film transistor;
a barrier layer located on the second metal layer, wherein the barrier layer includes a gap portion; the gap portion is corresponding to a channel location, wherein a width of one side of the gap portion close to the second metal layer is greater than that of the other side of the gap portion far away from the second metal layer;
an organic semiconductor layer including a channel, wherein the channel is corresponding to a location of the gap portion;
a second insulation layer located on the barrier layer, and being provided with a conductive through hole; and
a transparent conducting layer located on the second insulation layer, wherein the transparent conducting layer comprises a pixel electrode; and
the pixel electrode is connected with the second metal layer through the conductive through hole.

12. The array substrate according to claim 11, wherein the organic semiconductor layer further includes a deposition portion, and the deposition portion is located between the barrier layer and the second insulation layer.

13. The array substrate according to claim 11, wherein the barrier layer includes a first barrier layer and a second barrier layer; the second barrier layer is located on the first barrier layer; the first barrier layer includes a first gap portion, and the second barrier layer includes a second gap portion; and a width of the second gap portion is smaller than that of the first gap portion.

14. The array substrate according to claim 11, wherein a thickness of the barrier layer is greater than that of the drain electrode and the source electrode.

15. The array substrate according to claim 11, wherein the base substrate includes a buffer layer, and the buffer layer is located between the first metal layer and the base substrate.

* * * * *